(12) United States Patent
Sheu

(10) Patent No.: US 9,142,692 B2
(45) Date of Patent: Sep. 22, 2015

(54) THYRISTOR-BASED, DUAL-POLARITY BLOCKING PHOTO-CONDUCTIVE SEMICONDUCTOR SWITCH (PCSS) FOR SHORT PULSE SWITCHING AND METHODS

(71) Applicant: BAE Systems Information and Electronic Systems Integration Inc., Nashua, NH (US)

(72) Inventor: Yeuan-Ming Sheu, Berwyn Heights, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/947,451

(22) Filed: Jul. 22, 2013

(65) Prior Publication Data

US 2014/0021508 A1    Jan. 23, 2014

Related U.S. Application Data

(60) Provisional application No. 61/674,421, filed on Jul. 23, 2012.

(51) Int. Cl.
| | |
|---|---|
| H01L 31/02 | (2006.01) |
| H01L 29/74 | (2006.01) |
| H01L 31/0352 | (2006.01) |
| H01L 31/0224 | (2006.01) |
| H01L 31/111 | (2006.01) |

(52) U.S. Cl.
CPC .......... *H01L 31/02016* (2013.01); *H01L 29/74* (2013.01); *H01L 31/022408* (2013.01); *H01L 31/035272* (2013.01); *H01L 31/1113* (2013.01)

(58) Field of Classification Search
CPC ................. H01L 31/02016; H01L 31/035272; H01L 29/74
USPC ................... 257/113, 84, 115, 157, 164, 181; 438/87
See application file for complete search history.

(56) References Cited

U.S. PATENT DOCUMENTS

| | | | | | |
|---|---|---|---|---|---|
| 3,893,153 | A | * | 7/1975 | Page et al. ...................... | 257/115 |
| 4,016,593 | A | * | 4/1977 | Konishi et al. ................. | 257/116 |
| 4,053,922 | A | * | 10/1977 | Ferro ............................ | 257/115 |
| 4,208,669 | A | * | 6/1980 | Silber et al. ................... | 257/115 |
| 4,224,083 | A | * | 9/1980 | Cresswell ..................... | 438/134 |
| H0000695 | H | * | 10/1989 | Weiner et al. ................... | 257/21 |
| 5,278,434 | A | * | 1/1994 | Niwayama ..................... | 257/181 |
| 5,981,982 | A | * | 11/1999 | Driscoll ......................... | 257/138 |
| 2010/0072512 | A1 | * | 3/2010 | Giorgi et al. ................... | 257/109 |

\* cited by examiner

*Primary Examiner* — Sheng Zhu

(74) *Attorney, Agent, or Firm* — Daniel J. Long

(57) ABSTRACT

A system and method utilizing thyristor-based Photo-Conductive Semiconductor Switches (PCSS) for short pulse switching in high power microwave and/or broadband electromagnetic pulse generation is disclosed. The PCSS consists of thyristor-type NPNP structure having multiple emitter regions enclosed by the base region and multiple emitter shorts to divert leakage currents for voltage holding. The PCSS also includes an optical aperture comprised of patterned metallic grids for light illumination and current collection. The device structure is so constructed that there is only one single bevel around the peripheral. The thyristor-based PCSS have dual polarities of voltage blocking and have better efficiency for light requirement to operate at longer pulse duration compared to diode-based and bulk-semiconductor-based PCSS.

9 Claims, 6 Drawing Sheets

THYRISTOR-BASED, DUAL-POLARITY BLOCKING PHOTO-CONDUCTIVE SEMICONDUCTOR SWITCH (PCSS) FOR SHORT PULSE SWITCHING AND METHODS

STATEMENT OF GOVERNMENT INTEREST

This invention was made with United States Government support under Contract No. N41756-06-C-5521 awarded by the U.S. Department of the Navy. The United States Government has certain rights in this invention.

CROSS-REFERENCE TO RELATED APPLICATIONS

This Application claims rights under 35 USC §119(e) from U.S. application Ser. No. 61/674,421 filed 23 Jul. 2012 the contents of which are incorporated herein by reference.

TECHNICAL FIELD

Embodiments are generally related to high power Photo-Conductive Semiconductor Switches (PCSS). Embodiments are also related to high power Photo PCSS used in pulse power applications. Embodiments are additionally related to a method and system utilizing thyristor-based Photo-Conductive Semiconductor Switches (PCSS) for short pulse switching in high power microwave and/or broadband electromagnetic pulse generation.

BACKGROUND OF THE INVENTION

Photo-Conductive Semiconductor Switches (PCSS) have become important in high-speed optoelectronics and the generation and reshaping of ultrafast, high power electromagnetic pulses. PCSS are able to switch tens of kilovolts in sub-nanoseconds resulting in extremely high peak powers and are significantly advantageous over other voltage switches in easy fabrication, zero device-to-device jitter for multiple elements, and complete electrical isolation of the trigger.

PCSS are mostly based on either diode structure or bulk semiconductor. The diode-based PCSS, more specifically, P-i-N, consists of low doping semiconductor of high resistivity as the starting materials, and then P-type and N-type impurities are introduced on both sides to P-i-N doping profile. FIG. 1 and FIG. 2 illustrates cross sectional views of a diode-based PCSS 100. The PCSS 100 includes doped regions 102, 101 and 104 with junctions 103, 105 and 107, metallic electrodes (or terminals) 106 and 108, an optical aperture 107 on one of the electrodes and a single bevel profile 109 around the peripheral. The voltage holding is accomplished through the un-doped drift T region from the junction 103 near P-type region 102 and only in reverse bias. That is, diode-based PCSS 100 can only have one blocking polarity.

For certain circuit implementation, PCSS with dual blocking polarity are desired to simplify the circuit layout and reduce the number of component types. Bulk-type PCSS use lightly doped bulk semiconductor of high resistivity, and often additional doping of the same type is added near one or two electrodes, such as N-i-N type PCSS. The bulk-type PCSS is symmetric and can hold voltage in both polarities in general. However, the leakage current of bulk-type PCSS depends on the resistivity of starting material and is typically larger compared to those with junctions.

A need, therefore, exists for a new PCSS that can operate in dual polarities of voltage blocking and of less leakage. Also new PCSS should improve the stability of the devices while keeping the same form-factor as its diode-based counterparts without complicate bevels for edge termination.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the present invention to provide for high power Photo-Conductive Semiconductor Switches (PCSS).

It is another aspect of the disclosed embodiment to provide for high power Photo PCSS used in pulse power applications.

It is a further aspect of the disclosed embodiment to provide to a method and system utilizing thyristor-based Photo-Conductive Semiconductor Switches (PCSS) for short pulse switching in high power microwave and/or broadband electromagnetic pulse generation.

The present invention utilizes thyristor-based Photo-Conductive Semiconductor Switches (PCSS) for short pulse switching in high power microwave and/or broadband electromagnetic pulse generation. The PCSS consists of thyristor-type NPNP structure having multiple emitter regions enclosed by the base region and multiple emitter shorts to divert leakage currents for voltage holding. The PCSS also includes an optical aperture comprised of patterned metallic grids for light illumination and current collection. The device structure is so constructed that there is only one single bevel around the peripheral. The thyristor-based PCSS have dual polarities of voltage blocking and have better efficiency for light requirement to operate at longer pulse duration compared to diode-based and bulk-semiconductor-based PCSS of prior arts.

Thyristor-based photoconductive switches block both polarities of applied voltage; and more importantly, the present invention will improve the stability of the devices while keeping the same form-factor as its diode-based counterparts without complicate bevels for edge termination. For the same voltage rating capability, the present invention can have higher doping and thinner blocking layer for the same voltage rating capability, in turn, the devices of the present invention will need less light to achieve large current conducting state. With internal gain and regenerative action, the thyristor-based photoconductive switches can be used for long pulse duration without additional light illumination.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

The present invention is related to high power Photo-Conductive Semiconductor Switches (PCSS), especially, used in pulse power applications. Further, the operation of a PCSS is to have fast rise time and large peak current, that is, large switching power.

Figure 1:
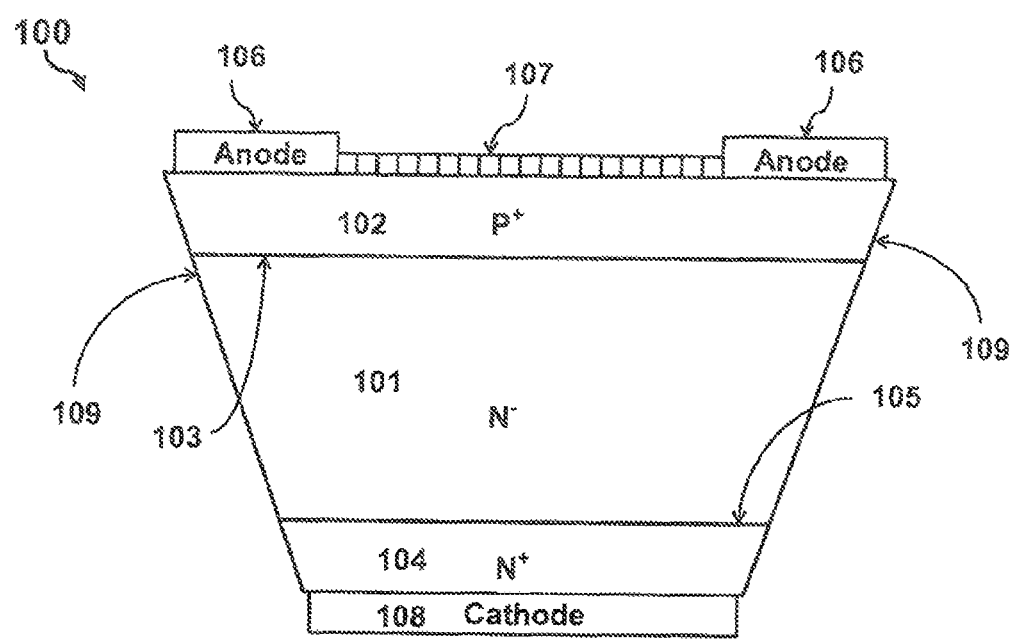
FIG. 1 illustrates a cross-section view of a prior art diode-based PCSS.
Figure 2:
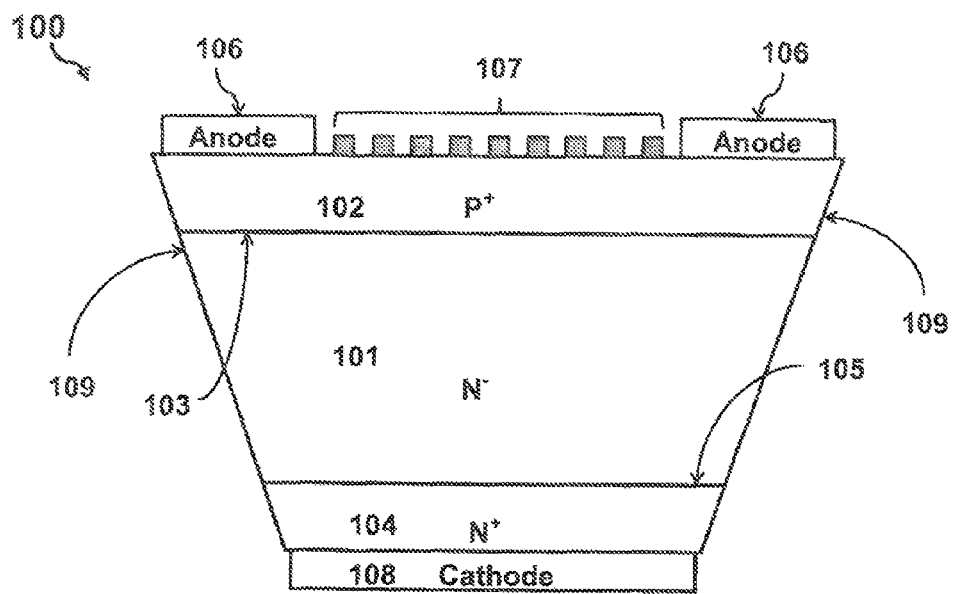
FIG. 2 illustrates an alternative cross-section view of a prior art diode-based PCSS, in accordance with the disclosed embodiments.
Figure 3:
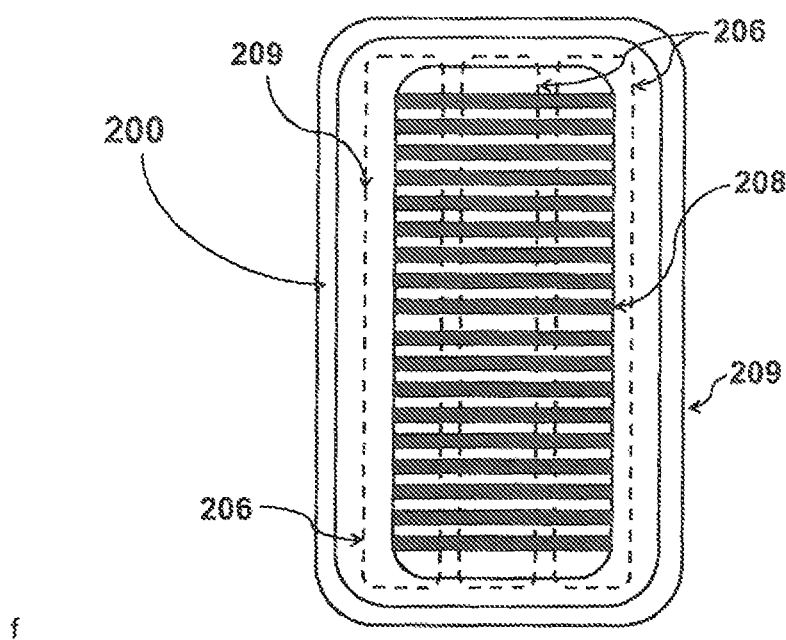
FIG. 3 illustrates a top view of a thyristor-based PCSS with multiple emitter regions, in accordance with the disclosed embodiments.
Figure 4:
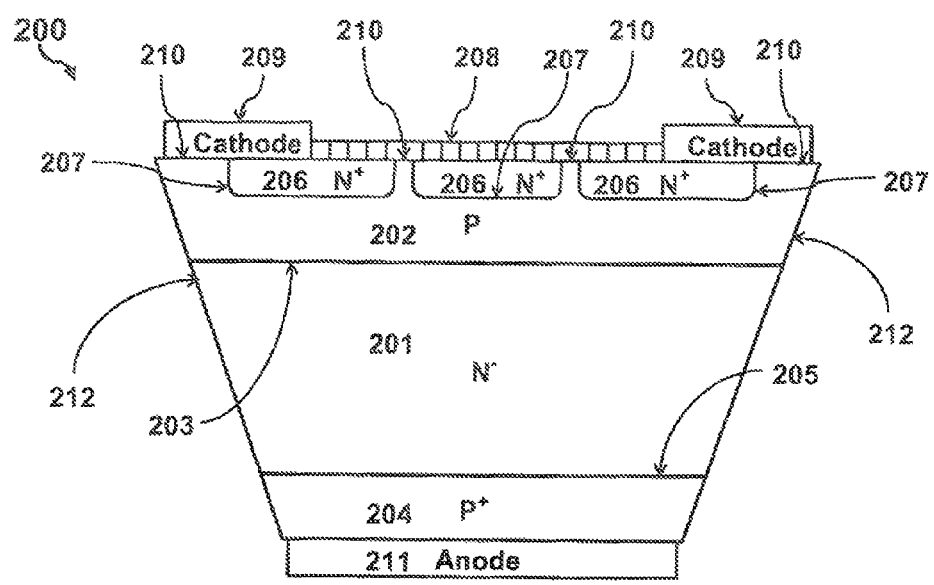
FIG. 4 illustrates a cross-section view of a thyristor-based PCSS with multiple emitters, in accordance with the disclosed embodiments.
Figure 5:
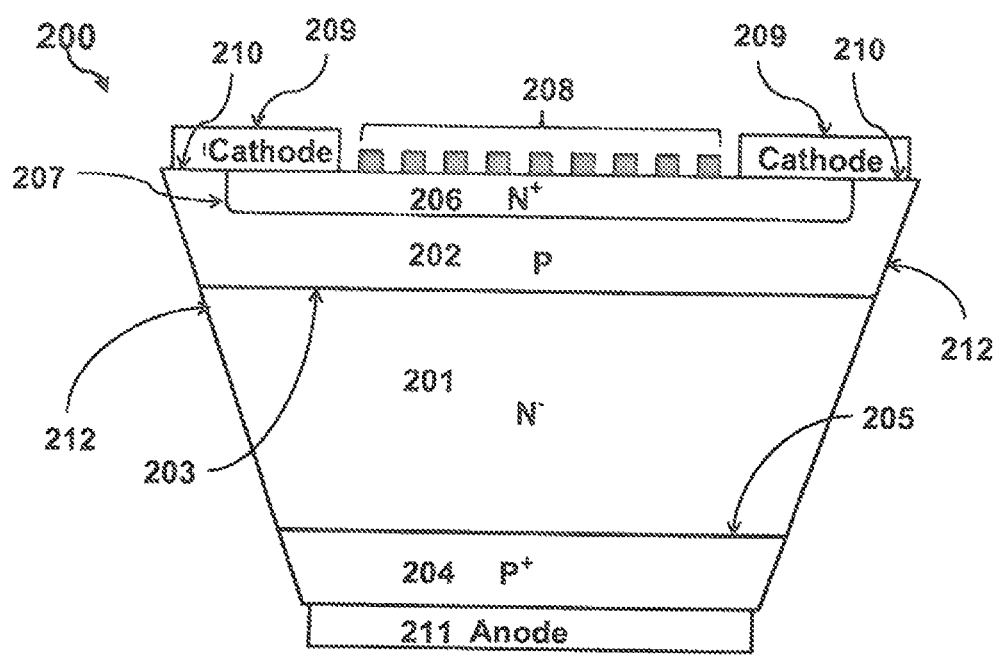
FIG. 5 illustrates an alternative cross-section view of a thyristor-based PCSS, in accordance with the disclosed embodiments.

AG. 3 illustrates a top view of a thyristor-based PCSS 200 with multiple emitter regions 206. The cross-sectional views of the thyristor-based PCSS 200 depicted in FIG. 3 are shown in FIGS. 4 and 5. The PCSS 200 comprises of alternatively-doped regions 201, 202, 204 and 206 with junctions 203, 205 and 207, metallic electrodes (or terminals) 209 and 211 on each side, an optical aperture 208 on one of the electrodes and a single bevel profile 212 around the peripheral. A PCSS 200 has multiple emitter regions 206 enclosed in the base region 202. Multiple emitter shorts or cathode shorts 210 are distributed with metallic links between the base region 202 and emitter regions 206.

Figure 6:
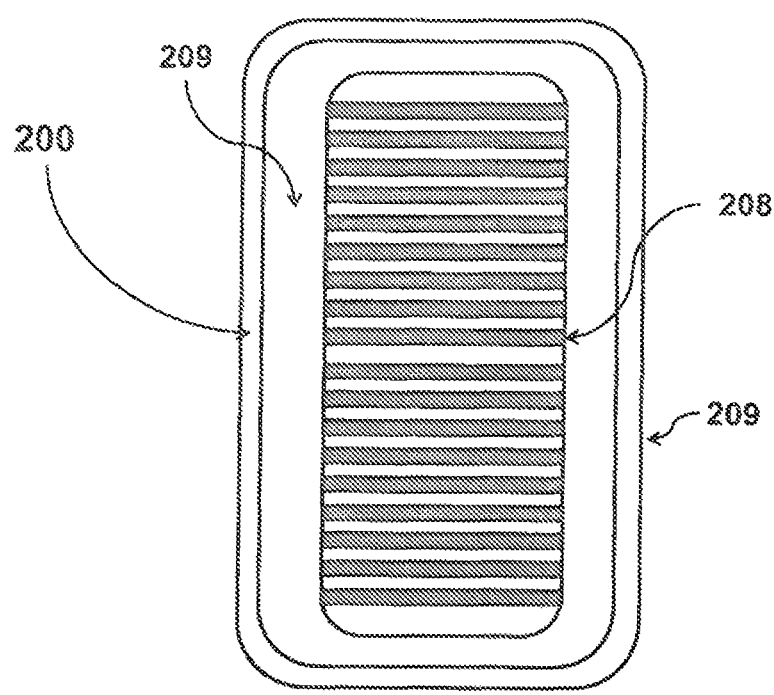
FIG. 6 illustrates a top view of a PCSS with an optical aperture, in accordance with the disclosed embodiments.

A PCSS 200 is a two terminal semiconductor device with an optical aperture 208 as shown in FIG. 6 on one of its electrodes 209. The optical aperture 208 consists of patterned metallic grids which admit light illumination and collects current to one of electrodes connected to the external circuit. The metallic grid pattern of an optical aperture can be of any form suitable for high power applications and is not limited to the embodiment shown in FIGS. 3-6.

The PCSS device is then fabricated through the diffusion, metallization and photolithography, bevel and passivation. The purpose of bevel 212 and passivation as a scheme of edge termination is to prevent surface breakdown, especially at the voltage holding junction where the electric field is high. After bevel 212, one side is wider and the optical aperture 208 can be introduced in the electrode 209 on the wider side of the device for larger aperture and ease of integration to circuit.

The patterned metallic grids are designed to be the optical aperture; and, at the same time, are collecting current from illuminated semiconductor regions. Since the emitter regions 206 are enclosed by the base region 202, the bevel 212 around the peripheral does not expose the emitter-base junction 207; and the thyristor-base PCSS 100 of have similar form factor of diode-base PCSS, except opposite nomenclature of electrodes.

Note that, diode-based devices are only blocking voltage in one single direction, i.e., reverse blocking. On the other hand, thyristor-based devices can be so design that they can block both directions of applied bias, forward and reverse blocking. However, the blocking capability of both directions is typically not symmetric and depends on the doping profile and edge termination schemes.

In a typical thyristor design, there are several emitter shorts created to bypass the leakage current during OFF state to prevent pre-mature turn-ON through current gain, especially in the forward blocking. The emitter shorts are distributed in array such that the leakage current can be bypassed without triggering injection from cathode, the emitter of NPN transistor. The emitter shorts will not impede the ON-state current (gain).

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A single thyristor-based Photo-Conductive Semiconductor Switch (PCSS), comprising:
    a NPNP device structure comprising
        a first region of silicon as the drift region having a first conductivity type;
        a second region of silicon as the base region on top of the first region having a second conductivity type;
        a plurality of third regions of silicon as emitter regions on top of the second region and enclosed within the second region without reaching the peripheral of the device, wherein a plurality of emitter shorts or cathode shorts are distributed with metallic links between the second region and the plurality of third regions; and
        a fourth region of silicon on bottom of the first region having a second conductivity type;
        a single bevel around the peripheral as the edge termination, wherein the single bevel makes the thyristor-based PCSS wider on one side, wherein the two-terminals comprise a first metallic contact on the surface of the fourth region of silicon as the anode electrode, and a second metallic contact on the surface of both the second and third regions as the cathode electrode;
        two terminals which electrically connects to the external circuit; and
        an optical aperture on one of its terminals on the wider side of the thyristor based PCSS, wherein the third region is positioned under the second metallic contact and the optical aperture.

2. The thyristor-based Photo-Conductive Semiconductor Switch (PCSS) of claim 1, wherein the edge termination around the peripheral comprises a bevel around the peripheral across the first, second and fourth regions; and, the bevel is formed with silicon removed the most in the fourth region, then first region and then second region.

3. The thyristor-based Photo-Conductive Semiconductor Switch (PCSS) of claim 1, wherein the optical aperture comprises patterned metallic grids contacted on the surface of the third regions; and, connected to one of two electrodes or terminals.

4. The thyristor-based Photo-Conductive Semiconductor Switch (PCSS) of claim 3, wherein a short pulse laser is introduced through the optical aperture for switching operation.

5. A method of fabricating a single thyristor-based Photo-Conductive Semiconductor Switch (PCSS), comprising:
forming a NPNP device structure comprising
forming a first region of silicon as the drift region having a first conductivity type;
forming a second region of silicon as the base region on top of the first region having a second conductivity type;
forming a plurality of third regions of silicon as emitter regions on top of the second region and enclosed within the second region without reaching the peripheral of the device, wherein a plurality of emitter shorts or cathode shorts are distributed with metallic links between the second region and the plurality of third regions; and
forming a fourth region of silicon on bottom of the first region having a second conductivity type;
forming a single bevel around the peripheral as the edge termination, wherein the single bevel makes the thyristor-based PCSS wider on one side;
electrically connecting two terminals to the external circuit, wherein the two-terminals comprise a first metallic contact on the surface of the fourth region of silicon as the anode electrode, and a second metallic contact on the surface of both the second and third regions as the cathode electrode; and
forming an optical aperture on one of its terminals on the wider side of the thyristor-based PCSS, wherein the third region is positioned under the second metallic contact and the optical aperture.

6. The method of claim 5, wherein the edge termination around the peripheral comprises a bevel around the peripheral across the first, second and fourth regions; and, the bevel is formed with silicon removed the most in the fourth region, then first region and then second region.

7. The method of claim 5, wherein the optical aperture comprises patterned metallic grids contacted on the surface of the third regions; and, connected to one of two electrodes or terminals.

8. The method of claim 7, wherein a short pulse laser is introduced through the optical aperture for switching operation.

9. A single thyristor-based Photo-Conductive Semiconductor Switch (PCSS), comprising:
a single NPNP device structure comprising
a first region of silicon as the drift region having a first conductivity type;
a second region of silicon as the base region on top of the first region having a second conductivity type;
a third region of silicon as emitter region on top of the second region and enclosed within the second region without reaching the peripheral of the device, wherein a plurality of emitter shorts or cathode shorts are distributed with metallic links between the second region and the third region; and
a fourth region of silicon on bottom of the first region having a second conductivity type;
a single bevel around a peripheral of the single NPNP device structure as the edge termination, wherein the single bevel makes the thyristor-based PCSS wider on one side;
two terminals which electrically connect to the external circuit, wherein the two-terminals comprise a first metallic contact on the surface of the fourth region of silicon as the anode electrode, and a second metallic contact on the surface of both the second and third regions as the cathode electrode; and
an optical aperture on one of its terminals on the wider side of the thyristor based PCSS, wherein the third region is positioned under the second metallic contact and the optical aperture.

* * * * *